United States Patent
Wang et al.

(10) Patent No.: US 9,275,913 B2
(45) Date of Patent: Mar. 1, 2016

(54) MEMORY ARRAYS FOR BOTH GOOD DATA RETENTION AND LOW POWER OPERATION

(71) Applicant: Intermolecular, Inc., San Jose, CA (US)

(72) Inventors: Yun Wang, San Jose, CA (US); Imran Hashim, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 152 days.

(21) Appl. No.: 14/133,555

(22) Filed: Dec. 18, 2013

(65) Prior Publication Data

US 2015/0171095 A1    Jun. 18, 2015

(51) Int. Cl.
| | |
|---|---|
| H01L 27/115 | (2006.01) |
| H01L 21/66 | (2006.01) |
| G11C 16/10 | (2006.01) |
| G11C 11/02 | (2006.01) |
| H01L 27/24 | (2006.01) |
| G11C 11/56 | (2006.01) |
| H01L 27/10 | (2006.01) |
| H01L 45/00 | (2006.01) |
| G11C 13/00 | (2006.01) |

(52) U.S. Cl.
CPC .............. *H01L 22/14* (2013.01); *G11C 11/02* (2013.01); *G11C 11/5685* (2013.01); *G11C 13/0007* (2013.01); *G11C 13/0035* (2013.01); *G11C 13/0069* (2013.01); *G11C 16/10* (2013.01); *H01L 27/101* (2013.01); *H01L 27/2463* (2013.01); *H01L 45/08* (2013.01); *H01L 45/085* (2013.01); *H01L 45/1233* (2013.01); *H01L 45/1266* (2013.01); *H01L 45/146* (2013.01); *H01L 45/147* (2013.01); *G11C 13/0004* (2013.01); *G11C 2013/0071* (2013.01); *G11C 2213/79* (2013.01); *H01L 45/06* (2013.01)

(58) Field of Classification Search
CPC ................................ G11C 16/10; H01L 22/14
USPC ........................................................... 365/148
See application file for complete search history.

(56) References Cited

U.S. PATENT DOCUMENTS

| | | | |
|---|---|---|---|
| 2013/0242648 A1* | 9/2013 | BrightSky | ............... H01L 45/06 365/163 |
| 2013/0250651 A1* | 9/2013 | Sills | ................... G11C 11/5685 365/148 |

OTHER PUBLICATIONS

Sheu et al.; Fast-Write Resistive RAM (RRAM) for Embedded Applications; Jan./Feb. 2011; IEEE; IEEE Design and Test of Computers, pp. 64-71.

* cited by examiner

*Primary Examiner* — Hoai V Ho
*Assistant Examiner* — Tri Hoang

(57) ABSTRACT

Designs and programming schemes can be used to form memory arrays having low power, high density and good data retention. High resistance interconnect lines can be used to partition the memory array can be partitioned into areas of high data retention and areas of low data retention. Variable gate voltages can be used in control transistors to store memory values having different data retention characteristics.

13 Claims, 12 Drawing Sheets

Initial Forming

Operational Switching

```
┌─────────────────────────────────────┐
│ Adjusting a voltage to a control    │
│ transistor of a memory cell in the  │
│ memory array                        │
│ 1200                                │
└─────────────────────────────────────┘
                  │
                  ▼
┌─────────────────────────────────────┐
│ Storing the memory value in the     │
│ memory cell                         │
│ 1210                                │
└─────────────────────────────────────┘
```

FIG. 12A

```
┌─────────────────────────────────────┐
│ Determining a retention requirement │
│ for the memory value                │
│ 1250                                │
└─────────────────────────────────────┘
                  │
                  ▼
┌─────────────────────────────────────┐
│ Calculate the control voltage based │
│ on the retention requirement of the │
│ memory value                        │
│ 1260                                │
└─────────────────────────────────────┘
                  │
                  ▼
┌─────────────────────────────────────┐
│ Applying the control voltage to a   │
│ control transistor of a memory cell │
│ in the memory array                 │
│ 1270                                │
└─────────────────────────────────────┘
                  │
                  ▼
┌─────────────────────────────────────┐
│ Storing the memory value in the     │
│ memory cell                         │
│ 1280                                │
└─────────────────────────────────────┘
```

FIG. 12B

MEMORY ARRAYS FOR BOTH GOOD DATA RETENTION AND LOW POWER OPERATION

FIELD OF THE INVENTION

This invention relates generally to nonvolatile memory elements, and more particularly, to methods for forming resistive memory elements used in nonvolatile memory devices.

BACKGROUND

Nonvolatile memory elements are used in systems in which persistent storage required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions, and therefore low power consumption. However, as device dimensions shrink and as operating voltages decrease, data retention issues are posing challenges for nonvolatile memory technology.

Therefore, there is a need for a memory array that can meet the design criteria for advanced memory devices.

SUMMARY

In some embodiments, methods, and memory arrays utilizing the methods, are provided to provide optimizations between low power, high density and good data retention. Some memory elements in a memory arrays can have high applied voltages, leading to high retention time. Some memory elements can have low applied voltages, thus can have low power consumption and high density. For example, after determining the retention requirement for a memory value, the memory value can be stored in a suitable memory location, e.g., having data retention similar to the retention requirement.

In some embodiments, provided are memory arrays having both high data retention and low programming/erasing (P/E) power. In general, there is fundamental trade-off of data retention v. P/E power, with high P/E power having high data retention. Thus to achieve high data retention and low P/E power, the memory array can have memory cells with different characteristics, e.g., some memory cells having high data retention with high P/E power and some memory cells having low P/E power with low data retention time.

In some embodiments, the memory array can be partitioned into areas of high data retention, high P/E power, and low cell density. The memory array can also be partitioned into areas of low data retention, low P/E power, and high cell density, which have denser memory cells with a same available power supply as the areas with high P/E power.

The area partitioning can be determined by its distance to the power (e.g., transistors delivering power to the memory cells). For example, the further away from the transistor, the load resistance of bit/word line is higher due to longer distance. With higher load resistor (e.g., further away from the transistor), the P/E power decreases and data retention is worse (e.g., lower).

In some embodiments, the areas of low data retention and low P/E power can be used to store memory cells having frequent programming erase applications, such a flash memory devices. The areas of high data retention and high P/E power can be used to store information requiring long data retention, such as embedded applications or applications requiring read only memory (ROM). In some embodiments, the memory values between areas can be switched, for example, to optimize the usage of memory area. For example, the information requires long time storage but has been stored in low retention memory cells can be transferred from the low data retention area to a high data retention area. Similarly the information requires short time storage but has been stored in high retention memory cells can be transferred from the high data retention area to a low data retention area. The data switching can be performed with additional circuits.

In some embodiments, the partition can be formed by using data lines having a line resistance so that there is a difference in voltage drop between memory elements near the voltage source and memory elements far from the voltage source. Since there is a voltage drop, the near memory elements can have high applied voltage, leading to high data retention characteristics. Conversely, the far memory elements can have lower applied voltage and lower ratio of programming to erase currents due to the voltage drop across the data line, thus can have low data retention characteristics.

In some embodiments, the memory array can be randomly used for different data retention characteristics. For example, different applied voltages can be used for different memory elements of the memory array when different data retention characteristics are needed for the memory value stored at this memory element.

In some embodiments, the voltages applied to the memory elements can be controlled by the transistors used to control the load lines. For example, in a cross point memory array, each memory element can be controlled by a transistor, which is coupled to the load line. When the transistor is on, the memory element is selected, e.g., for reading or writing.

In some embodiments, the voltage to the gate of the control transistor can be controlled according to the retention requirement of the memory value that is stored in the memory element. High gate voltages can reduce the resistance of the transistor, leading to high voltages applied to the memory elements to provide high retention characteristics. Low gate voltages can increase the resistance of the transistor, leading to low voltages applied to the memory elements to provide low power consumption but with low retention characteristics.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 12A-12B illustrate flowcharts for programming a memory array according to some embodiments.

DETAILED DESCRIPTION

Figure 1A:
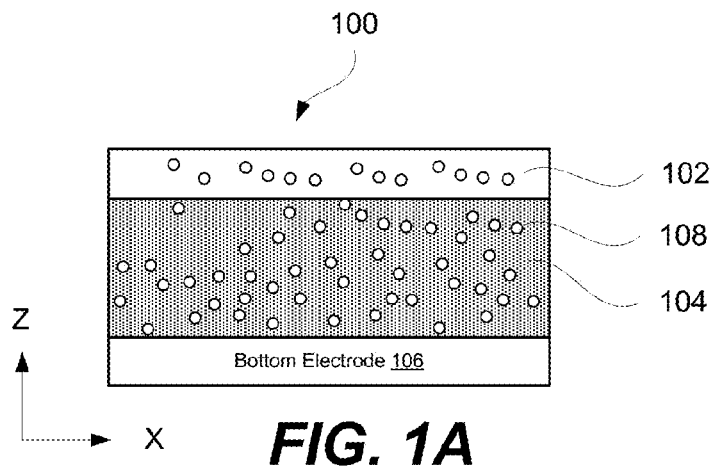
FIGS. 1A-1C illustrate a schematic representation of a ReRAM operation according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, methods, and memory arrays utilizing the methods, are provided to provide memory arrays having low power, high density and good data retention characteristics. In prior art memory arrays, there is a trade-off between low power and high data retention, e.g., a memory array can be optimized for low power application, while another memory array can be optimized for high data retention.

In some embodiments, the invention recognizes that data retention characteristic is related to the programming voltages or currents, e.g., the set and reset voltages or currents that are applied to the memory element. Thus, by controlling the programming voltages, the data retention characteristics can also be controlled.

In some embodiments, designs and programming schemes can be applied to a memory array to achieve both low power consumption and high data retention. For example, certain bits, e.g., memory elements, of the memory array can have good data retention but higher programming current (lower density) to store some long term information with less frequent programming/reading time. Other bits can have higher density with lower programming current but worse data retention. Those bits can store the information with frequent programming/read but not required to store for long term.

In some embodiments, the designs and programming schemes can include varying the load resistances to the memory bits in the memory array. In some embodiments, the interconnect line between the bits can be designed to have a certain resistance, instead of the very low resistance usually associated with interconnect lines. In general, the line resistance is configured so that the memory elements at the near end of the interconnect line has higher data retention that the memory elements at the far end of the interconnect line. For example, the interconnect lines can have a resistance between 5 kΩ and 100 kΩ between the first and last memory elements. The interconnect line can have a resistance of 10-1000× the resistance of the memory elements.

In some embodiments, the designs and programming schemes can include using the row/column transistor to control the interconnect line. In these designs, the areas for different memory criteria can be dynamic, e.g., any memory element can be programmed to have high retention or low power consumption. In some embodiments, the load resistance can be controlled by transistor's gate voltage. Higher gate voltage can form lower load resistance, thus when long term information is store, the gate voltage can be tuned to a high value while selecting the row/column for the bits.

In the following description, resistive switching memory is described in great details. However, the invention is not limited to resistive switching memory, but can be equally applied to memory structures using resistance changes, such as phase change memory.

A ReRAM cell exhibiting resistive switching characteristics generally includes multiple layers formed into a stack. The structure of this stack is sometimes described as a Metal-Insulator-Metal (MIM) structure. Specifically, the stack includes two conductive layers operating as electrodes. These layers may include metals and/or other conductive materials. The stack also includes an insulator layer disposed in between the electrode. The insulator layer exhibits resistive switching properties characterized by different resistive states of the material forming this layer. As such, this insulator layer is often referred to as a resistive switching layer. These resistive states may be used to represent one or more bits of information. The resistance switching properties of the insulator layer are believed to depend on various defects' presence and distribution inside this layer. For example, different distribution of oxygen vacancies in the layer may reflect different resistance states of the layer, and these states may be sufficiently stable for memory application.

To achieve a certain concentration of defects in the resistance switching layer, the layer has been conventionally deposited with defects already present in the layer, i.e., with preformed defects. In other words, defects are introduced into the layer during its formation. For example, tightly controlled Atomic Layer Deposition (ALD), Physical Vapor Deposition (PVD), or some other low-temperature process to remain within a Back End of Line (BEOL) thermal budget may be used to deposit the insulator layer of the stack. It may be difficult to precisely and repeatedly control formation of these defects particularly in very thin resistance switching layers (e.g., less than 100 Angstroms). For example, when ALD is used to form resistance switching layers, some unreacted precursors may leave carbon-containing residues that impact resistance characteristics of the deposition layers and ReRAM cells including these layers. Furthermore, achieving precise partial saturation repeatedly may be very difficult if possible at all. In the case of PVD, sputtering targets tend to wear out influencing the deposition rates and creating variation in resulting resistance switching layers.

Methods of forming nonvolatile memory elements can involve transferring oxygen from precursor layers (used to form or, more specifically, converted into resistance switching layers) to electrodes during annealing of the stacks. The annealing environment may include some hydrogen to control distribution of oxygen within the annealed structure.

As stated above, oxygen diffusion from the precursor layer into the electrode converts the precursor layer into a resistance switching layer. The precursor layer may include a stoichiometric oxide or near-stoichiometric oxide that cannot function as a resistance switching layer until oxygen vacancies or some other defects are formed within that layer. The metal of this oxide may be more electronegative than the metal of the electrode used to trap the oxygen diffused out of the precursor level. The electrode may have substantially no oxygen at least prior to the oxygen transfer but may form an oxide during annealing.

The stack may have a reactive electrode that receives some oxygen during annealing and an inert electrode that generally does not participate in oxygen transfer. The inert electrode may be referred to as an oxygen-resistant electrode and may be made from titanium nitride, tantalum nitride, platinum, gold, and the like. Other suitable materials for inert electrodes include various conductive oxide, such as iridium oxide and ruthenium oxide. In some embodiments, the inert electrode includes an oxide sub-layer facing the resistance switching layer. The rest of the electrode may be formed by the metal of this oxide and may be generally free of oxygen. For example, an initial structure may be fabricated from a metal and then pretreated to form an oxide layer resulting in an inert electrode. This electrode then receives a precursor layer and another reactive electrode formed over the precursor layer. During subsequent annealing, the inert electrode does not experience any significant oxygen transfer, while the reactive electrode receives oxygen from the precursor layer that is converted into the resistive switching oxide layer as it loses oxygen.

If an inert electrode with a protective oxide layer is a first formed electrode in the stack (i.e., the bottom electrode), then it can be first deposited as a metal layer followed by a short low-temperature anneal in oxygen. On the other hand, if an inert electrode is the last electrode formed in the stack (i.e., the top electrode), then its deposition can be initiated in the oxygen environment (e.g., sputtering in an oxygen-containing plasma) to form an initial oxide sub-layer followed by deposition in an inert environment to form the remaining metal (and oxygen free) portion of the electrode.

A reactive electrode can be made from a material that reacts with oxygen to form a non-conductive oxide. Some examples of suitable materials include aluminum, titanium, tantalum, chromium, praseodymium, molybdenum, tungsten, and niobium.

A precursor layer may be made from materials, such as tantalum oxide ($Ta_2O_5$), niobium oxide ($Nb_2O_5$), titanium oxide ($TiO_2$), hafnium oxide ($HfO_2$), strontium titanate ($SrTiO_3$), or other suitable transition metal oxides, perovskite manganites, or rare earth oxides. The precursor layer may include a stoichiometric oxide or near-stoichiometric oxide. For example, oxygen vacancies in the precursor layer may have a concentration of less than 0.1 atomic percent prior to its annealing.

Annealing may be performed on a fully formed stack including two electrodes and precursor layer or a partially formed stack that includes only one electrode (the second electrode is formed after the annealing). Other types of layers may also be present in these stacks. As stated above, annealing performed at relatively mild conditions to achieve better control over oxygen diffusion between one or more reactive layers and precursor layer. Annealing may form a graded composition of oxygen vacancies in the precursor layer.

The resistive switching layer changes its resistive state when a certain switching voltage (e.g., a set voltage or a reset voltage) is applied to this layer as further explained below. The applied voltage causes localized heating within the layer and/or at one of both of its interfaces with other components. Without being restricted to any particular theory, it is believed that a combination of the electrical field and localized heating (both created by the applied voltage) causes formation and breakage of various conductive paths within the resistive switching layer and/or at its interfaces. These conductive paths may be established and broken by moving defects (e.g., oxygen vacancies) within the resistive switching layer and through one or more interfaces that resistive switching layer forms with adjacent layers.

The interfaces can be inert interfaces or reactive interfaces. The inert interface generally does not have any substantial defect transfer through this interface. While the defects may be present within one or both layers forming this interface, these defects are not exchanged through the inert interface when switching, reading, or other types of voltages are applied to the ReRAM cell. The reactive interface generally experiences a transfer of defects through this interface. When a resistive switching layer includes an oxygen containing material, such as metal oxides, the reactive interface is formed by an oxygen reactive material, such as titanium. The inert interface may be formed by a material that is not oxygen reactive, which may be a part of an electrode or a diffusion barrier layer. In some embodiments, the flux of defects through the reactive interface is at two or more orders of magnitude greater than the flux of defects through the inert interface. As such, the "inert" and "reactive" naming convention is relative.

The inert interface provides a control for the resistive switching layer while defects are moved in and out of the resistive switching layer through the reactive interface. For example, when a switching voltage is applied to the resistive switching layer in order to reduce its resistance, the reactive interface allows defects to flow into the layer. The defects are typically driven by the electrical potential applied to the layer and form conductive paths through the layer. The direction of this flow may be determined by the polarity of the switching voltage and/or by the electrical charge of the defects (e.g., positive charged oxygen vacancies). At the same time, the second inert interface prevents defects from escaping the layer despite the driving potential. If both interfaces are reactive and allow defects to pass through, then the resistive switching layer may gain defects at one interface and loose at another. In this situation, the layer may never be able to gain enough defects to form conductive paths.

The above scenario is applicable in a very similar manner to a resetting operation during which the resistive switching layer is brought to its high resistance state. When a switching voltage is applied to the layer in order to increase its resistance of the layer, the reactive interface allows defects to flow out of the layer. The defects may also be driven by the electrical potential applied to the layer as described above. The loss of defects may eventually break conductive paths in the layer. At the same time, the second inert interface prevents defects from entering the layer despite the driving potential. If both interfaces are reactive and allow defects to pass through during the resetting operation, then the resistive switching layer may gain defects at one interface and loose at another. In this situation, the layer may never be able to lose enough defects in order to break it conductive paths. It should be noted that defects are often mobile in many times of resistive switching materials.

The ability of an interface to block defects (as in the inert interface) or to allow defects to diffuse through the interface (as in the reactive interface) depends on properties of a layer forming this interface together with the resistive switching layer. Often conductive electrodes are used to form both reactive and inert interfaces. These electrodes may be referred to as reactive and inert electrodes and materials used to form these electrodes may be referred to as reactive and inert materials. It should be noted that this terminology (i.e., reactive and inert) refers to primarily to defect mobility properties of the interfaces. Some examples of inert electrode materials include doped polysilicon, platinum, ruthenium, ruthenium oxide, gold, iridium, coppers, silver, and tungsten. Examples of reactive electrode materials include titanium. Furthermore, some materials may be defined as semi-inert including tantalum nitride, tantalum silicon nitride, and tungsten silicon nitride. In the context of oxygen containing resistive switching materials, such as metal oxides, reactive materials may be also referred to as oxygen reaction materials since oxygen or oxygen vacancies are exchanged through the reactive interface. Titanium is one example of oxygen reactive materials, however other examples may be used as well.

A brief description of ReRAM cells and their switching mechanisms are provided for better understanding of various features and structures associated with methods of forming nonvolatile memory elements further described below. ReRAM is a non-volatile memory type that includes dielectric material exhibiting resistive switching characteristics. A dielectric, which is normally insulating, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

Figure 1B:
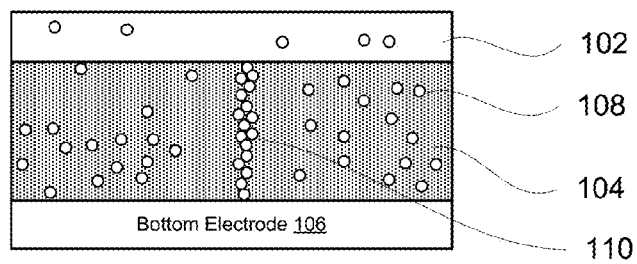
Figure 1C:
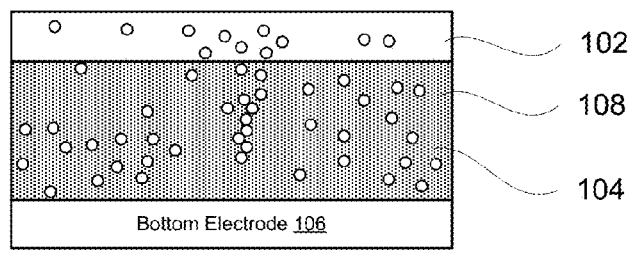

FIGS. 1A-1C illustrate a schematic representation of a ReRAM operation according to some embodiments. A basic building unit of a memory device is a stack having a capacitor like structure. A ReRAM cell includes two electrodes and a dielectric positioned in between these two electrodes. FIG. 1A illustrates a schematic representation of ReRAM cell 100 including top electrode 102, bottom electrode 106, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, and other components. ReRAM cell 100 is sometimes referred to as a memory element or a memory unit.

Top electrode 102 and bottom electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the resistive switching layer. That is, defects may travel through an interface formed by this electrode with the resistive switching layer (i.e., the reactive interface). The other interface of the resistive switching layer may be inert and may be formed with an inert electrode or a diffusion barrier layer.

Resistance switching layer 104 which may be initially formed from a dielectric material and later can be made to conduct through one or more conductive paths formed within the layer by applying first a forming voltage and then a switching voltage. To provide this resistive switching functionality, resistance switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

In some embodiments, these defects may be utilized for ReRAM cells operating according to a valence change mechanism, which may occur in specific transition metal oxides, nitrides, and oxy-nitrides. For example, defects may be oxygen vacancies triggered by migration of oxygen anions. Migrations of oxygen anions correspond to the motion of corresponding oxygen vacancies that are used to create and break conductive paths. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature. Some of these mechanisms will be further described below with reference to FIGS. 1A-1C. In the described examples, top electrode 102 is reactive, while bottom electrode 106 is inert or is separated from resistive switching layer 104 by a diffusion barrier layer (not shown). One having ordinary skills in the art would understand that other arrangements are possible as well and within the scope of this disclosure.

Specifically, FIG. 1A is a schematic representation of ReRAM cell 100 prior to initial formation of conductive paths, in accordance with some embodiments. Resistive switching layer 104 may include some defects 108. Additional defects 108 may be provided within top electrode 102 and may be later transferred to resistive switching layer 104 during the formation operation. In some embodiments, the resistive switching layer 104 has substantially no defects prior to the forming operation and all defects are provided from top electrode 102 during forming. Bottom electrode 106 may or may not have any defects. It should be noted that regardless of the presence or absence of defects in bottom electrode 106, substantially no defects are exchanged between bottom electrode 106 and resistive switching layer 104 during forming and/or switching operations.

During the forming operation, ReRAM cell 100 can change its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistance switching layer 104 to form these conductive paths 110 as, for example, schematically shown in FIG. 1B. Furthermore, some or all defects 108 forming the conductive paths may enter resistive switching layer 104 from top electrode 102. For simplicity, all these phenomena are collectively referred to as reorientation of defects within ReRAM cell 100. This reorientation of defects 108 occurs when a certain forming voltage 104 is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Resistive switching involves breaking and reforming conductive paths through resistive switching layer 104, for example switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or re-formed. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into top electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and top electrode 102, the conductive paths may break closer to the interface with bottom electrode 106, somewhere within resistive switching layer 104, or at the interface with top electrode 102. This breakage generally does not correspond to complete dispersion of defects forming these conductive paths and may be a self limiting process, i.e., the process may stop after some initial breakage occurs.

When switching from its HRS to LRS, which is often referred to as a set operation, resistive switching layer 104 may receive some defects from top electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 104 during the set operation has the same polarity as a voltage applied during the reset operation. This type of switching is referred to as unipolar switching. Some examples of cells that exhibit unipolar switching behavior include resistive switching layers formed from most metal oxide and having inert electrodes at both sides, e.g., Pt/MeO$_x$/Pt. Alternatively, a voltage applied to electrodes 102 and 104 during the set operation may have different polarity as a voltage applied during the reset operation. This type of switching is referred to as bipolar switching. Some examples of cells that exhibit bipolar switching behavior include resistive switching layers formed from MeOx having one inert electrode and one reactive electrode, e.g., TiN/MeOx/Pt and TiN/MeOx/poly-Si. Setting and resetting operations may be repeated multiple times as will now be described with reference to FIGS. 2A and 2B.

Figure 2A:
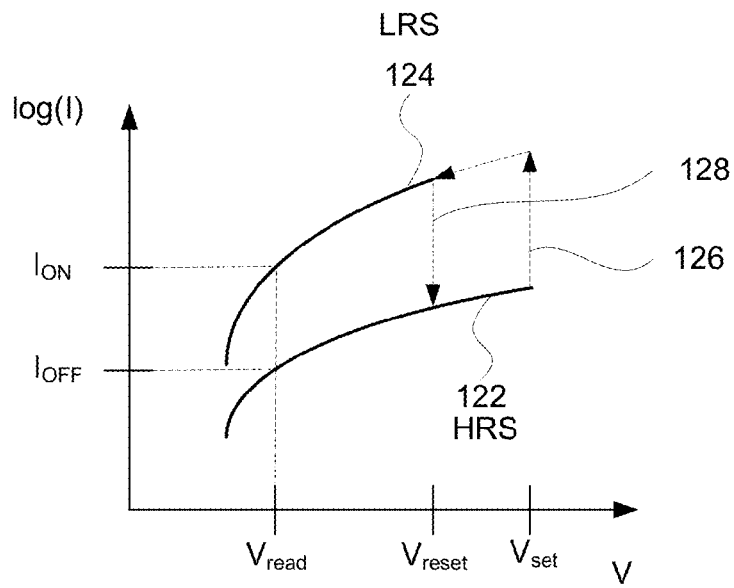
FIG. 2A illustrates a plot of a current passing through a unipolar ReRAM cell as a function of a voltage applied to the ReRAM cell, in accordance with some embodiments.
Figure 2B:
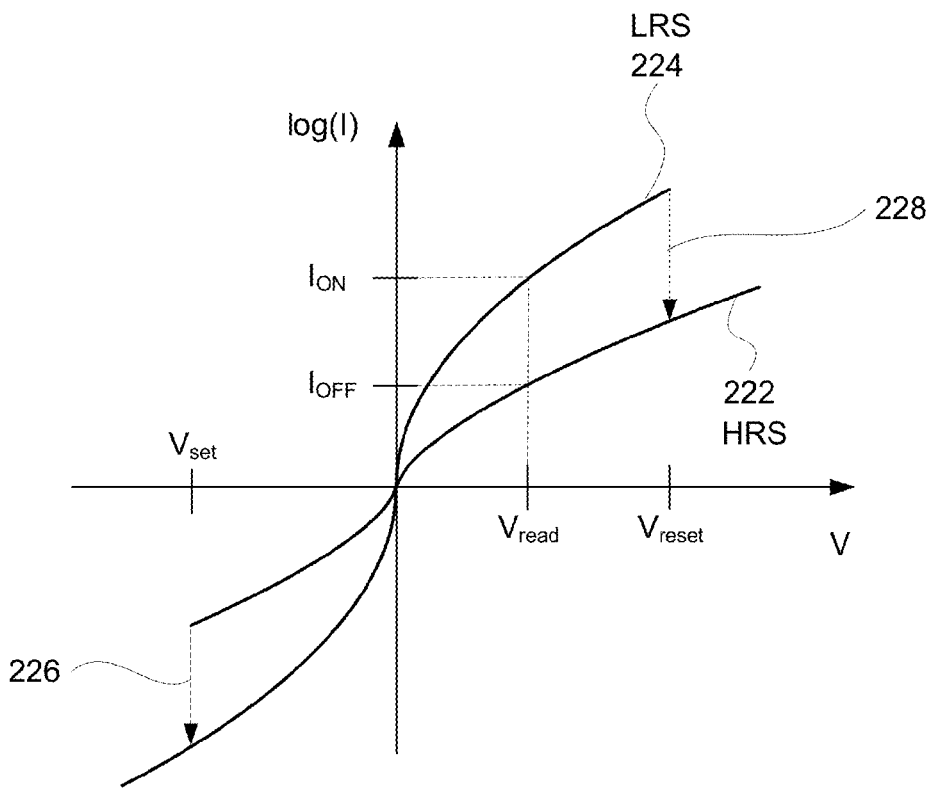
FIG. 2B illustrates the same type of a plot for a bipolar ReRAM cell, in accordance with some embodiments.

FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in FIG. 2A and by lines 222 and 224 respectively in FIG. 2B. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistance switching layer can be sensed by applying a sensing voltage to its electrodes. The sensing voltage is sometimes referred to as a "READ" voltage or simply a reading voltage and indicated as $V_{READ}$ in FIGS. 2A and 2B. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistance switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistance switching layer. Switching from a LRS to HRS is indicated by dashed line 128 in FIG. 2A and line 228. Detecting the state of the ReRAM cell while it is in its HRS is described above.

It should be noted that polarity of the reset voltage and the set voltage may be the same as shown in FIG. 2A or different as shown in FIG. 2B. The cells that have the same polarity of set and reset voltages are referred to as unipolar cells, while the cells that have different polarities of h set and reset voltages are referred to as bipolar cells. Without being restricted to any particular theory, it is believed that unipolar switching occurs due to metallic filament formation and destruction caused by resistive heating and application of electrical field. Bipolar switching is believed to be based on filaments formed from oxygen vacancies. The formation and rupture of filament is done by oxygen vacancy moving back and forth. The switching voltages of unipolar and bipolar switching are typically comparable. However, the endurance of bipolar is generally better than that of unipolar.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 12V or, more specifically, between about 500 mV and 5V. In some embodiments, the read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers In some embodiments, the same ReRAM cell may include two or more resistance switching layers interconnected in series. Adjacent resistance switching layers may directly interface each other or be separated by an intermediate layer.

The ReRAM cells can be configured in a cross point memory array. The cross point memory arrays can include horizontal word lines that cross vertical bit lines. Memory cells can be located at the cross points of the word lines and the bit lines. The memory cells can function as the storage elements of a memory array.

Figure 3:
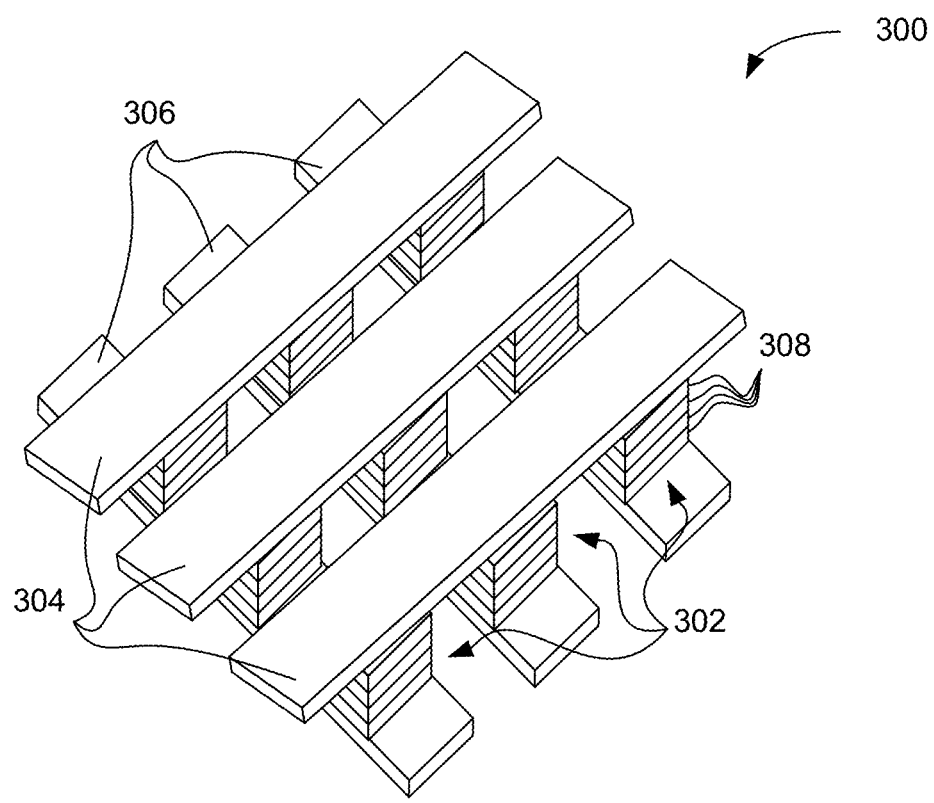
FIG. 3 illustrates a memory array of resistive switching memory elements according to some embodiments.

FIG. 3 illustrates a memory array of resistive switching memory elements according to some embodiments. Memory array 300 may be part of a memory device or other integrated circuit. Memory array 300 is an example of potential memory configurations; it is understood that several other configurations are possible.

Read and write circuitry may be connected to memory elements 302 using signal lines 304 and orthogonal signal lines 306. Signal lines such as signal lines 304 and signal lines 306 are sometimes referred to as word lines and bit lines and are used to read and write data into the elements 302 of array 300. Individual memory elements 302 or groups of memory elements 302 can be addressed using appropriate sets of signal lines 304 and 306. Memory element 302 may be formed from one or more layers 308 of materials, as is described in further detail below, and may include additional elements such as those described below, including selection or steering elements.

One having ordinary skills in the art would understand that other arrangements of memory cells are possible; in particular, a memory array can be a 3-D memory array. For example, several 2-D memory arrays (as shown in FIG. 3) can be stacked in a vertical fashion to make multi-layer 3-D memory arrays. As another example, one set of signal lines can be composed of vertical lines, and the other set of signal lines can be a composed of one or more subsets of horizontal lines, the subsets (if applicable) being positioned at an angle (e.g. orthogonally) to each other, and the memory devices can be formed as substantially concentric cylindrical layers around the vertical lines.

Any suitable read and write circuitry and array layout scheme may be used to construct a non-volatile memory device from resistive switching memory elements such as element 302. For example, horizontal and vertical lines 304 and 306 may be connected directly to the terminals of resistive switching memory elements 302. This is merely illustrative.

During the operation of the cross point memory array, such as a read operation, the state of a memory element 302 can be sensed by applying a sensing voltage (i.e., a "read" voltage) to an appropriate set of signal lines 304 and 306. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a write operation, the state of a memory element can be changed by application of suitable write signals to an appropriate set of signal lines 304 and 306.

In some embodiments, methods, and memory arrays utilizing the methods, are provided to form memory arrays having low power, high density and good data retention. The data retention characteristic is recognized as related to the load resistance, thus data retention for a memory element can be improved by increasing the voltage or current applied to the memory element.

Figure 4A:
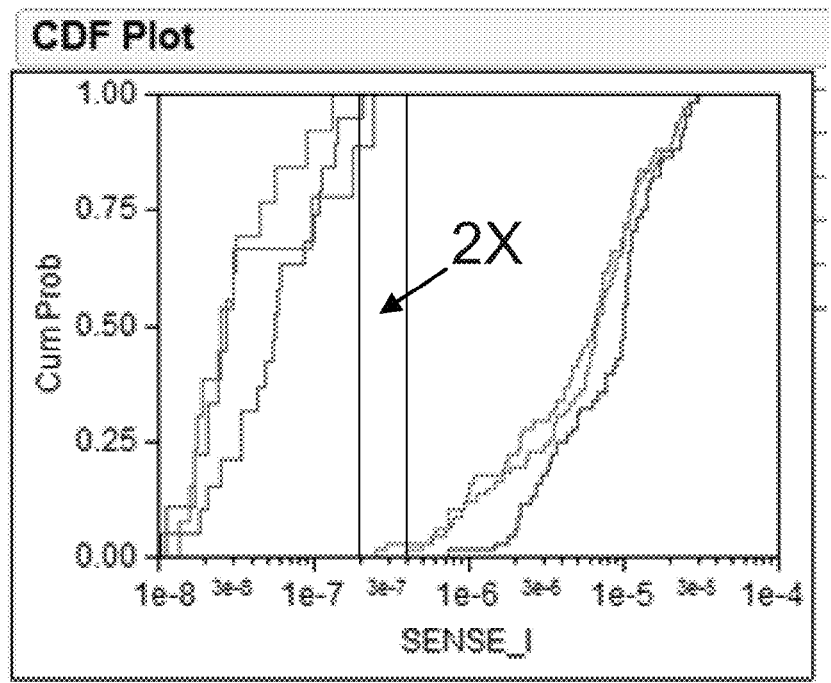
FIGS. 4A-4B illustrate retention data of memory devices having different load resistances according to some embodiments.
Figure 4B:
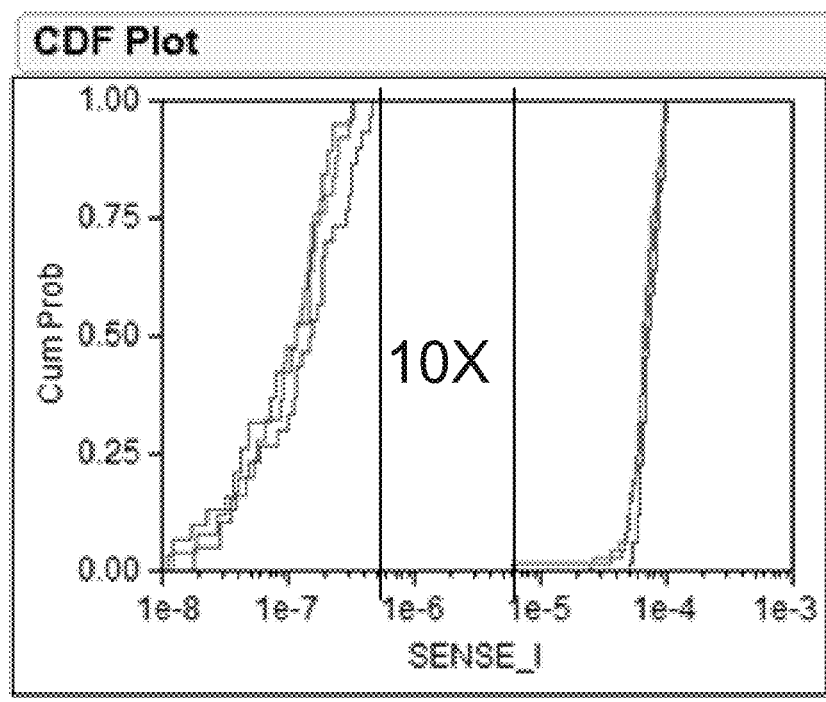

FIGS. 4A-4B illustrate retention data of memory devices having different load resistances according to some embodiments. FIG. 4A shows the current probability for on and off currents for a memory element with high load resistance of 13 kΩ after 1 week annealing. With high load resistance, the programming current is about 200 μA for the memory element having 150 nm by 150 nm size. As shown, after 1 week annealing, the ratio of the on/off current drops to about 2×.

FIG. 4B shows the current probability for on and off currents for a memory element with low load resistance of 5 kΩ after 1 week annealing. With low load resistance, the programming current is about 500 μA for the memory element having 150 nm by 150 nm size. As shown, after 1 week annealing, the ratio of the on/off current is at least about 10×. Thus a memory element can be optimized to have high data retention with low load resistance or high programming current. Alternatively, a memory element can be optimized to have low programming current, e.g., low power consumption and high density by increasing its load resistance, resulting in low data retention behavior.

Figure 5:
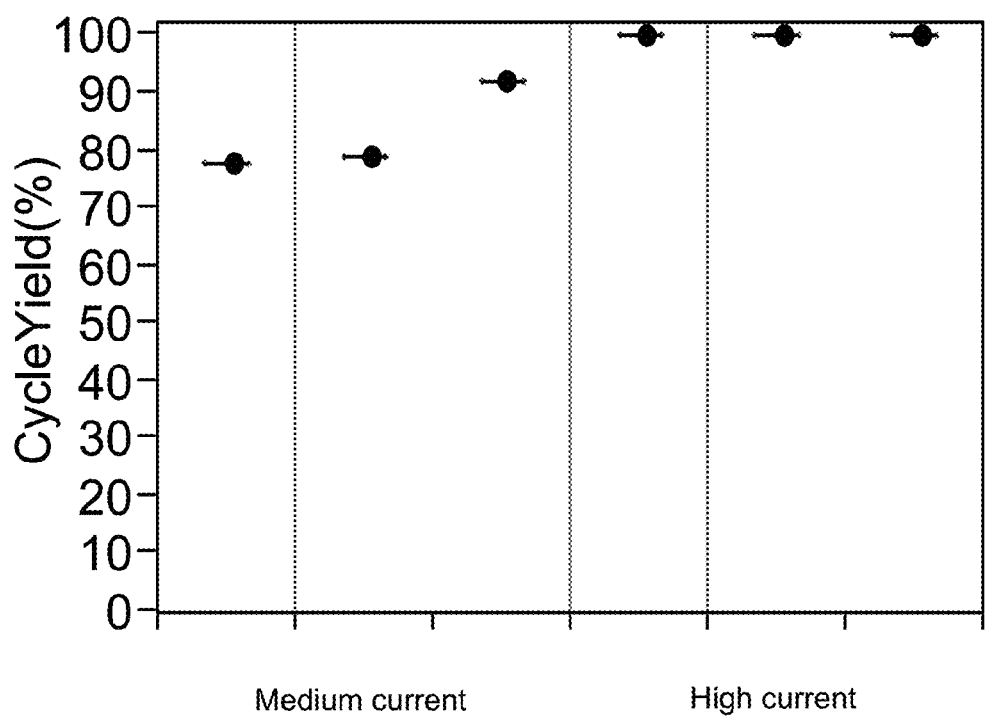
FIG. 5 illustrates a variability chart for cycle yield percentage for memory elements according to some embodiment.

FIG. 5 illustrates a variability chart for cycle yield percentage for memory elements according to some embodiments.

High cycle yield of about 100% can be achieved for high current programming, while lower cycle yield (about 80%) is achieved for low current programming.

In some embodiments, methods are provided to obtain memory arrays with high retention and low power consumption. Certain memory bits in the memory array can have high programming voltage or current to achieve high retention characteristic. Other memory bits in the memory array can have low programming voltage or current to achieve low power consumption.

In some embodiments, before storing a value to a memory array, a retention requirement can be determined. The value then can be stored in a memory bit with appropriate retention characteristic. For example, if a value will be stored for long term use, high retention time can be needed, and the value can be stored with high retention behavior, e.g., programmed with high voltage or current to achieve high retention. If a value is a temporary variable, or will be frequently used, low retention time can be applied, and the value can be stored with low retention behavior to reduce the power consumption, e.g., programmed with low voltage or current.

Figure 6:
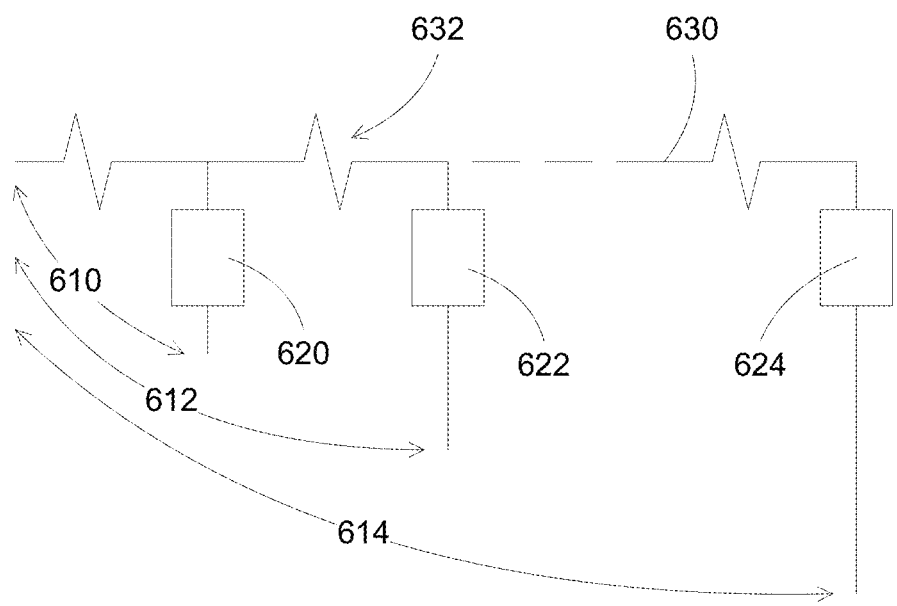
FIG. 6 illustrates a basic programming scheme for memory storage according to some embodiments.

FIG. 6 illustrates a basic programming scheme for memory storage according to some embodiments. Memory elements 620, 622, and 624 can be coupled to an interconnect line 630, such as a bit line or a word line. The interconnect line 630 can have a line resistance 632, which can be comparable with the resistance of the memory elements. For example, the line resistance 632 can be such that the voltages or currents through the memory elements are different. The voltages 610, 612, and 614 applied to the interconnect line 630 can be the same, which is the operating voltage of the memory array. Since the interconnect line 630 has line resistance, there can be voltage drop across the portion of the interconnect line connecting to the memory elements. Thus the voltage applied to, or the current running through, the memory elements 620, 622, and 624 can be different.

With the high load resistance, e.g., high voltage drop from the power source to the memory cells, the ratio of programming and erasing current decreases, leading to lower data retention time. Thus the memory cells further away from the power source can have lower P/E power and low data retention time.

In some embodiments, the line resistance 632 can be configured so that the difference in applied voltages can generate a difference in data retention in these memory elements. Alternatively, the line resistance 632 can be such that the data retention for first memory 620 is higher then the data retention for last memory 624 in the interconnect line 630. For example, the memory elements can be partitioned into multiple groups with different retention characteristics. For two group partitioning, memory elements 620 and 622 can have high retention since the memory elements are closer to the voltage source, and the voltage drop can be small. Memory element 624 can have low retention since the memory element is farthest from the voltage source, and the voltage drop can be significant, resulting in low applied voltage or current through the memory element.

In some embodiments, the memory array can be partitioned into multiple areas having different data retention characteristics. For example, memory elements near the driver circuit can have high retention. Memory elements far from the driver circuit can have low retention. The partition can be formed by fabricating the interconnect lines with appropriate line resistance. For example, the line resistance for the interconnect lines in a memory array can be configured so that the memory elements near the driver circuit can have higher retention than the memory elements farther from the driver circuit. The interconnect lines can have a line resistance of less than 1 MΩ or less than 100 kΩ.

Figure 7:
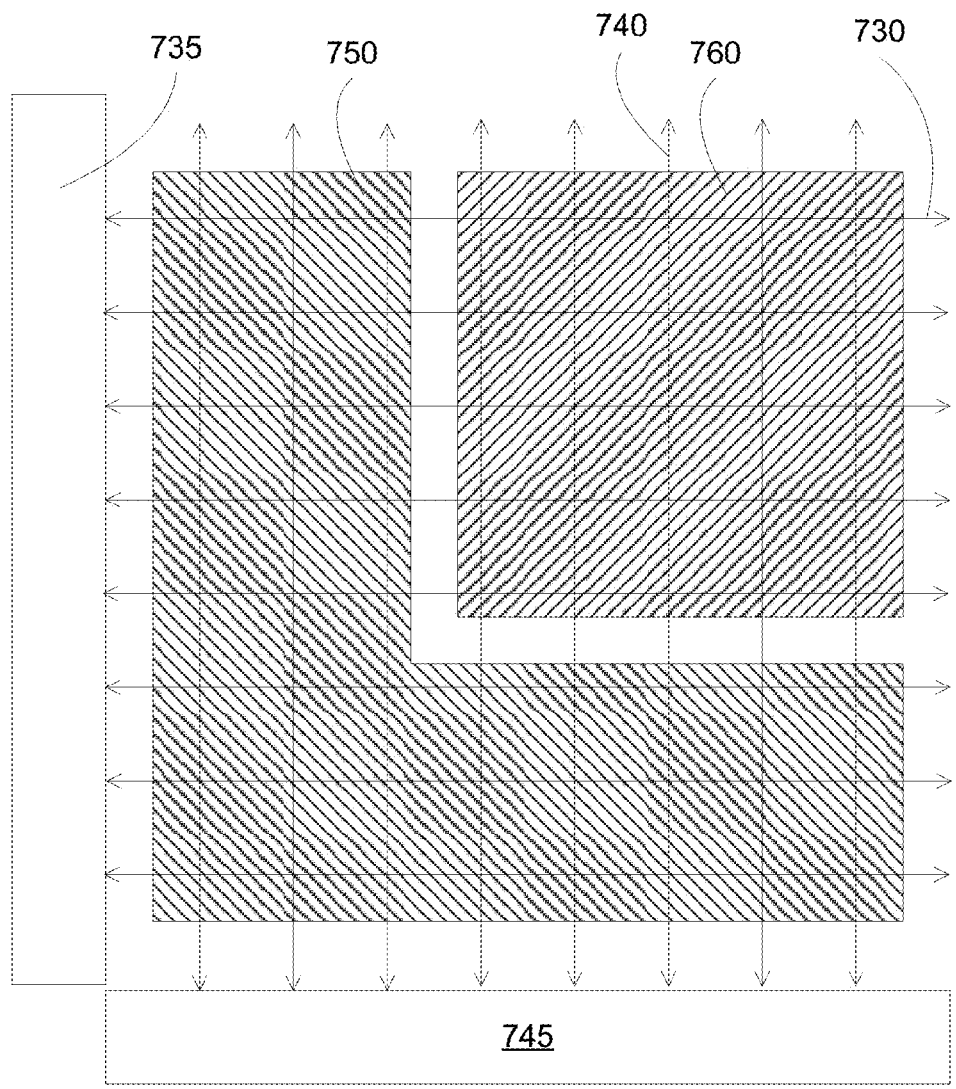
FIG. 7 illustrates a cross point memory array with a schematic retention partitioning according to some embodiments.

FIG. 7 illustrates a cross point memory array with a schematic retention partitioning according to some embodiments. Interconnect lines 730 and 740, e.g., bit lines and word lines, for the memory array can be perpendicular to each other with a memory element disposed at the intersection of the interconnect lines. The interconnect lines 730 and 740 can have a line resistance. Interconnect lines 730 can be coupled to driver circuit 735, for example, to apply a voltage to the interconnect lines 730. Interconnect lines 740 can be coupled to driver circuit 745, for example, to apply a voltage to the interconnect lines 740. Memory elements in area 750 near the driver circuits 735 and 745 can have high data retention, since the portion of the interconnect lines is short, and the resistance and voltage drop is small, leading to a high voltage or current through the memory elements. Memory elements in area 760 away from the driver circuits 735 and 745 can have low power consumption (and low data retention), since the portion of the interconnect lines is long, and the resistance and voltage drop can be significant, leading to a low voltage or current through the memory elements. Thus the memory array can be configured to have both high data retention and low power consumption areas, with one area 750 having high retention and another area 760 having low power.

In addition, area 760 can be configured to have higher cell density as compared to area 750. Due to low P/E power consumption at the area 760, more memory cells can be placed in area 760 for a same power consumption of the other area 750.

Other partition schemes can be used. For example, additional driver circuits can be implemented at the free end of the interconnect lines, e.g., the interconnect lines 730 and 740 can be placed between driver circuits. In this configuration, the area having high data retention can be at the peripheral of the memory array, forming a donut ring. The memory elements at the middle of the memory array can have low power consumption. In addition, multiple areas having multiple retention differences can be used, such as three retention areas including an area having high retention, an area having medium retention and an area having low retention.

In some embodiments, programming schemes are provided for forming memory arrays with different memory elements having different retention or different power consumption. The interconnect lines can have zero or negligible line resistance, and the memory element each can have a variable resistor connected in series. The variable resistors can allow different voltages or currents to be applied to the memory elements, thus providing different retention characteristics.

Figure 8A:
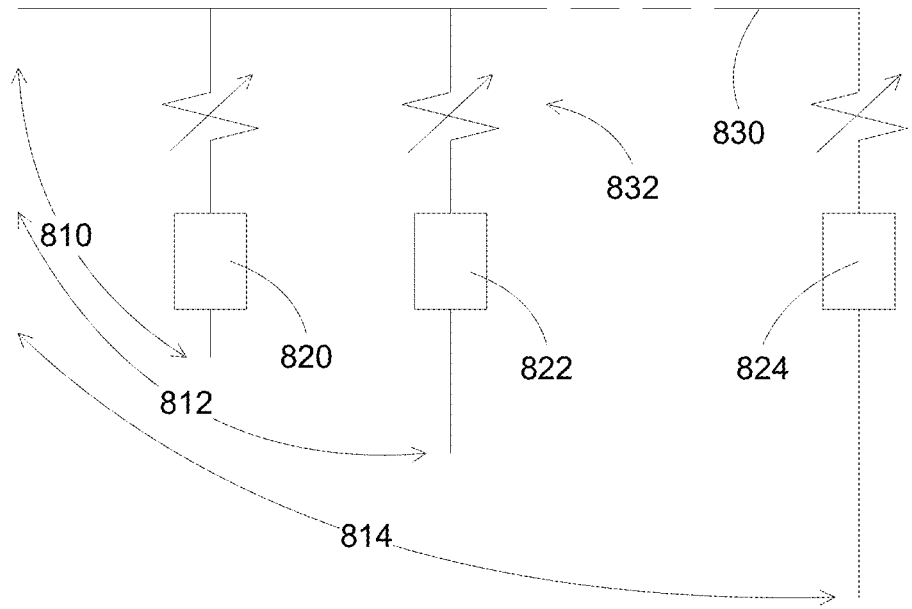
FIG. 8A illustrates a basic programming scheme for memory storage using variable resistors according to some embodiments.

FIG. 8A illustrates a basic programming scheme for memory storage using variable resistors according to some embodiments. Memory elements 820, 822, and 824 can be coupled to an interconnect line 830, such as a bit line or a word line, each through a variable resistor 832. The interconnect line 830 can be a normal interconnect line, e.g., with zero or minimum line resistance. The voltages 810, 812, and 814 applied to the combination of variable resistor and memory element can be the same, which is the operating voltage of the memory array. Since the memory elements are coupled in series with a variable resistor, there can be different voltage drops across the variable resistors connected to the memory elements. Thus the voltage applied to, or the current running through, the memory elements 820, 822, and 824 can be different. The variable resistors 832 can be configured so that the difference in applied voltages can generate a difference in data retention in these memory elements.

In some embodiments, the variable resistor includes a transistor with the changes in resistance related to the changes in applied gate voltage to the transistor. The transistor can be the row/column transistor which is coupled to the memory element and the interconnect lines to control the flow of voltages or currents to the memory element. The memory array can be a normal memory array, e.g., a memory array configured for either high density, low power or for high retention. The scheme to transform the normal memory array to a memory array capable of storing both low power and high retention can include changing the gate voltages that are applied to the control transistors of the memory array. For example, when storing long term information, the gate voltage can be tuned to be high (e.g., to reduce the load resistance) while selecting the row/column for the memory element.

Figure 8B:
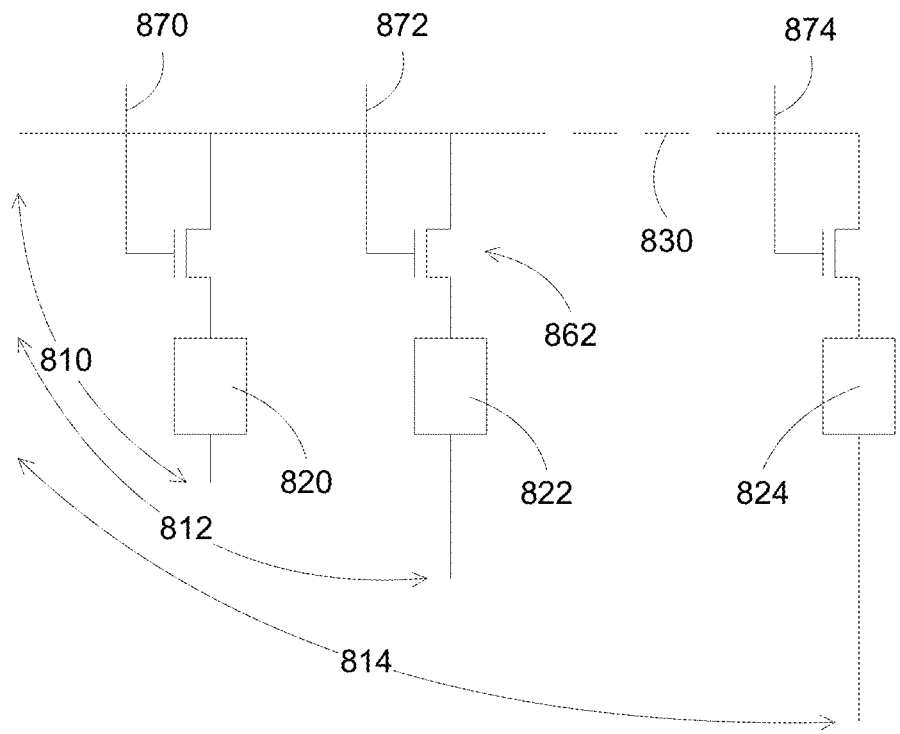
FIG. 8B illustrates a basic programming scheme for memory storage using control transistors according to some embodiments.

FIG. 8B illustrates a basic programming scheme for memory storage using control transistors according to some embodiments. Memory elements 820, 822, and 824 can be coupled to an interconnect line 830, such as a bit line or a word line, each through a control transistor 862. To access the memory elements, the control transistors can be turned on, e.g., a voltage is applied to the gate of the transistor.

In some embodiments, the gate voltages 870, 872, and 874 can be different when accessing memory elements 820, 822 and 824, respectively. High gate voltages can form low transistor resistance, low resistance across the source and drain of the control transistor. The low transistor resistance can lower the load resistance to the memory device (e.g., a combination of the control transistor and the memory element), allowing a high voltage or current to be applied to the memory element. The high voltage or current can form a memory bit with high retention characteristic. Similarly, low gate voltages can form memory bits with low power consumption and low retention characteristic.

Figure 9:
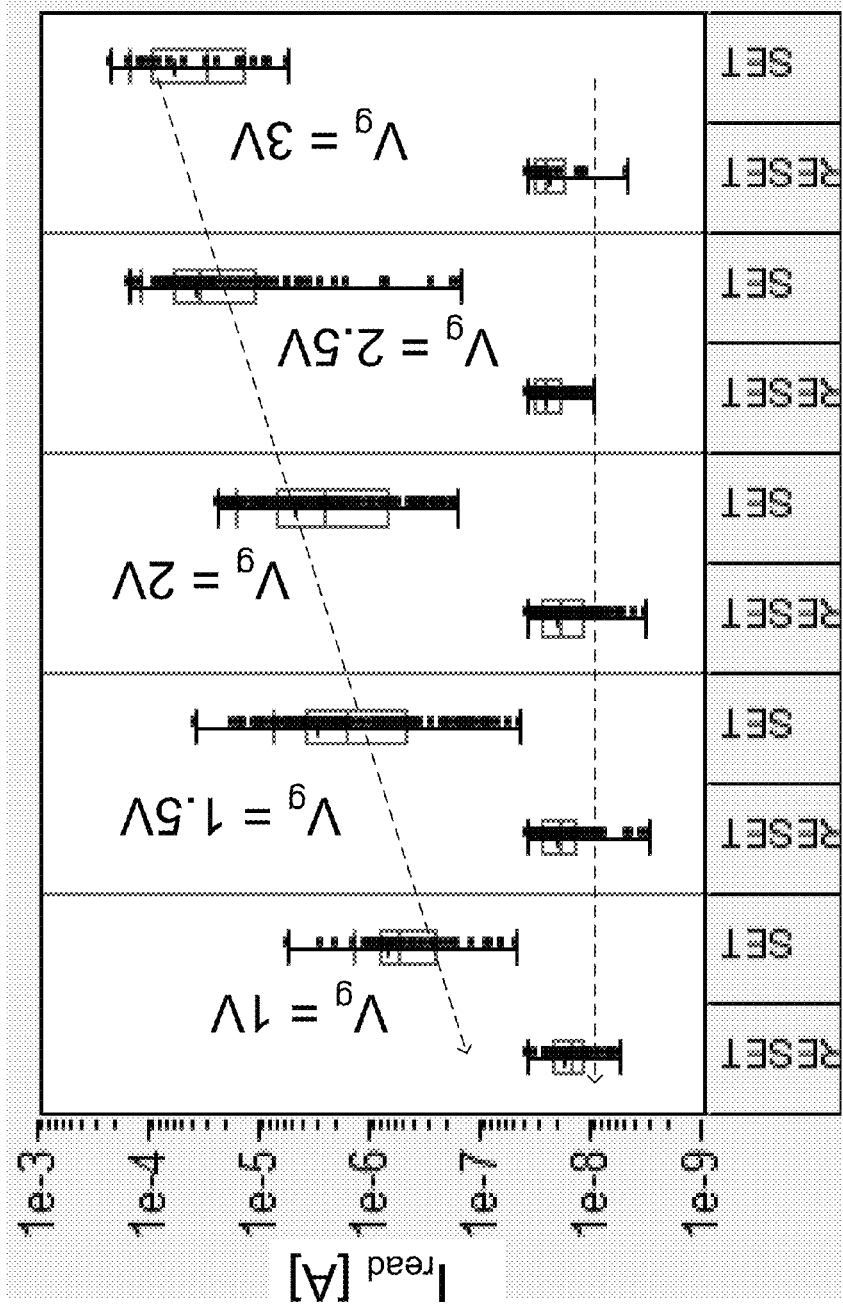
FIG. 9 illustrates current responses of a memory device with different gate voltages according to some embodiments.

FIG. 9 illustrates current responses of a memory device with different gate voltages according to some embodiments. Different set operations for a memory element are performed with different gate voltages, e.g., between 1 V to 3 V. As shown, the set currents, e.g., the currents through the memory element to program the memory element to a low resistance state, correspondingly increase from $10^{-7}$ A to $10^{-4}$ A. In the figure, the reset currents are constant if the reset voltage is programmed to vary up to the reset transition, e.g., when the off-current is less than about 40 nA.

Figure 10:
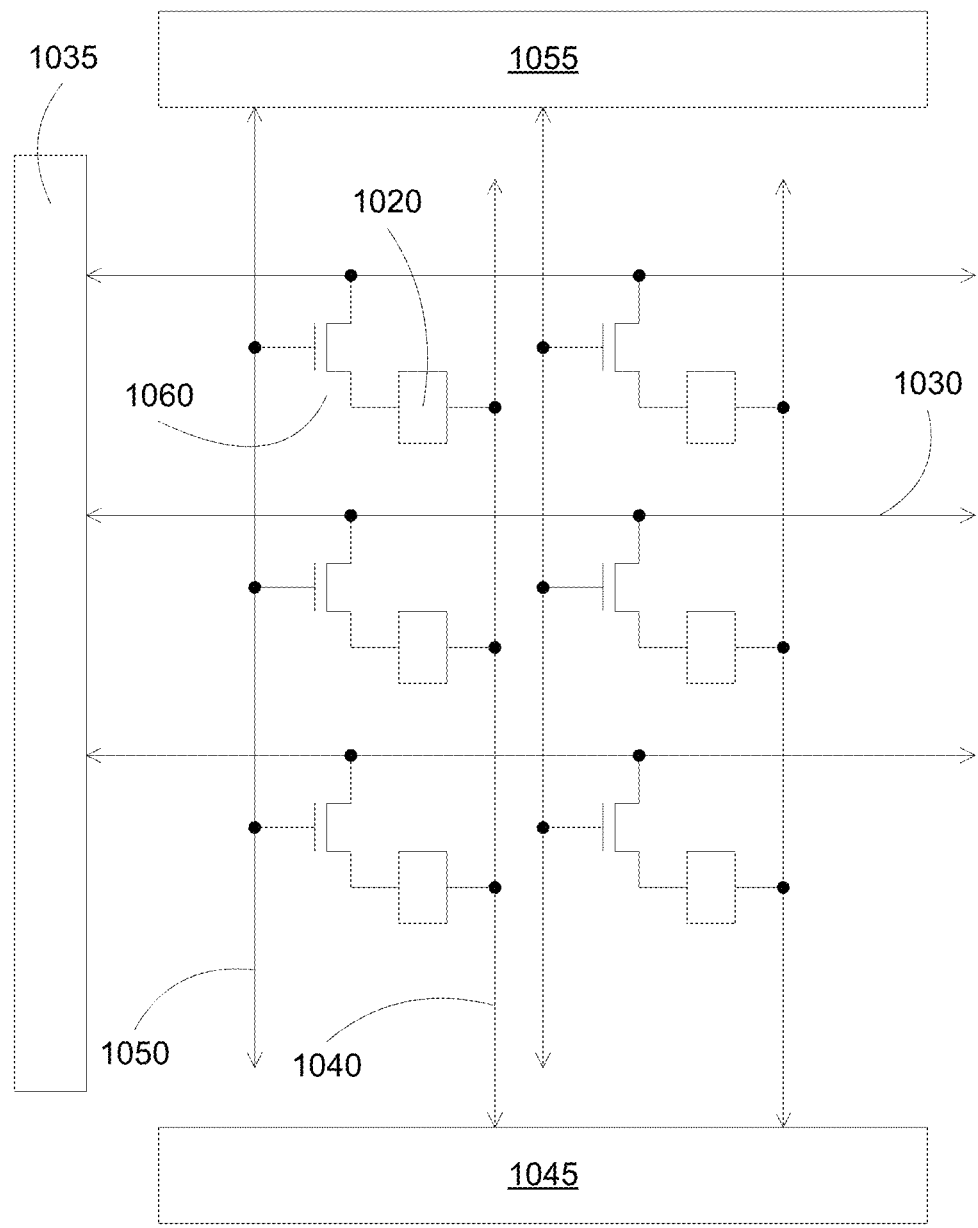
FIG. 10 illustrates a cross point memory array according to some embodiments.

FIG. 10 illustrates a cross point memory array according to some embodiments. A switching memory device can include a memory element 1020, which is disposed between the interconnect lines 1030 and 1040. A transistor steering element 1060 can be used to isolate the memory devices, for example, through the control lines 1050. The memory device 1020 can be connected in series with the transistor 1060. Control lines 1850 can be used to turn on transistor 1860, to select memory element 1820. Driver circuits 1035, 1045 and 1055 can be used to control the interconnect lines 1030, 1040, and control lines 1050. For example, driver circuits 1035 and 1045 can be used to provide programming voltage or current to the selected memory element. The driver circuit 1055 can vary the voltage which can be applied to the gate of the control transistor of the selected memory element.

In operation, the control driver circuit 1055 can generate gate voltages according to a retention requirement of the memory values to be stored. High retention requirements can result in high gate voltages generated from the driver circuit 1055. After the gate voltage is applied, the driver circuits 1035 and 1045 generate programming voltages or currents to the selected memory devices. With the appropriate gate voltages, the memory values can be stored with appropriate retention characteristic.

The locations of the memory devices for high or low retention can be randomly distributed throughout the memory array. Any memory bits can be programmed for storing long term memory values (e.g., high retention) or for storing short term memory values (e.g., low retention). The memory array can be a normal transistor-controlled memory array, with the ability to select between high retention or low power consumption accomplished by a program algorithm.

In some embodiments, a control driver circuit, e.g., driver circuit 1055 for generating variable gate voltages, can be added to a normal memory array, so that the transistors can receive different gate voltages based on the retention requirement.

The above description is for a resistive switching memory device. However, the invention is not so limited, and can be applied to other types of resistive memory devices, such as phase change memory.

Figure 11A:
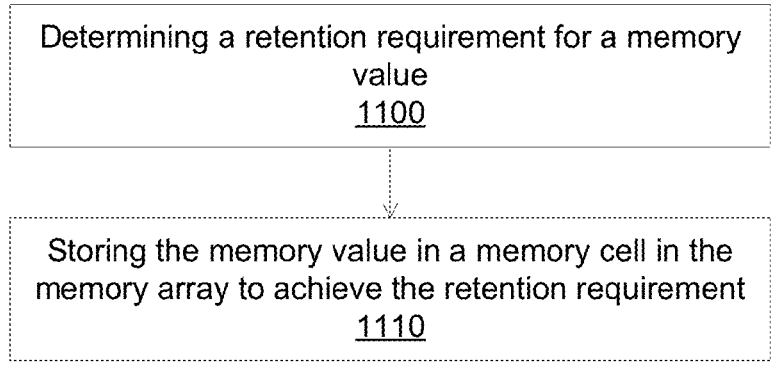
FIGS. 11A-11B illustrate flowcharts for programming a memory array according to some embodiments.
Figure 11B:
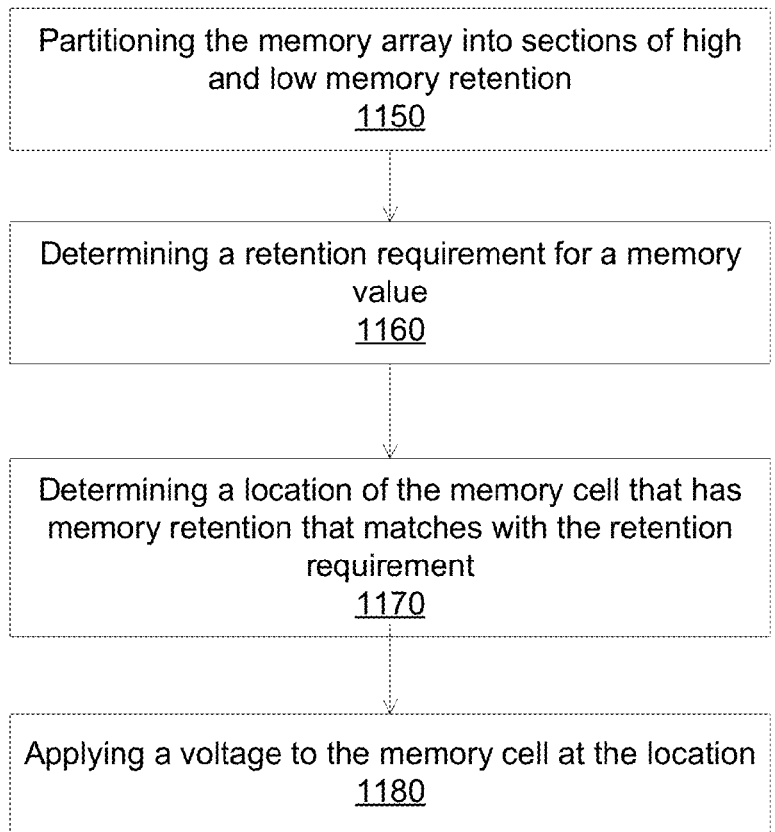

FIGS. 11A-11B illustrate flowcharts for programming a memory array according to some embodiments. In FIG. 11A, in operation 1100, a retention requirement for a memory value is determined, for example, whether the memory value is to be stored for long term or for short term. In some embodiments, the determination is automatic or pre-determined, such as variables from a program are to be short term memory. In operation 1110, the memory value is stored in a memory cell in the memory array to achieve the retention requirement. For example, if the memory array includes interconnect lines having high line resistance (e.g., significantly larger than the zero or negligible resistivity of a conduction line), high retention memory can be stored in memory locations at a vicinity of the driver circuit. Low retention memory can be stored in memory locations far from the driver circuits. If the memory array includes control transistors, high gate voltages can be generated to store high retention memory values.

In FIG. 11B, in operation 1150, the memory array is partitioned into sections of high and low memory retention. For example, if the memory array includes interconnect lines having high line resistance, memory locations in a vicinity of the driver circuit are used to store high retention values, and memory locations far from the driver circuits are used to store low retention values. In operation 1160, a retention requirement for a memory value is determined. In operation 1170, a location of the memory cell determined that has memory retention that matches with the retention requirement. In operation 1180, a voltage is applied to the memory cell at the location to store the memory value.

FIGS. 12A-12B illustrate flowcharts for programming a memory array according to some embodiments. In FIG. 12A, in operation 1200, a gate voltage to a control transistor of a memory cell in the memory array is adjusted in response to a retention requirement for a memory value. In some embodiments, the adjustment is automatic or pre-determined, such as variables from a program are to be short term memory, thus incurring a low voltage generation. In operation 1210, the memory value is stored in a memory cell in the memory array to achieve the retention requirement. For example, high gate voltages can be generated to store high retention memory values.

In FIG. 12B, in operation 1250, a retention requirement for a memory value is determined. In operation 1260, a control voltage is calculated, for example, through a look-up table or a algorithm, on the retention requirement of the memory value. In operation 1270, the control voltage is applied to a gate of a control transistor of a memory cell in the memory array. In operation 1280, a voltage is applied to the memory cell at the location to store the memory value.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for forming a memory array, the method comprising:
    forming a first section of memory cells in the memory array,
        wherein the first section has a first density of memory cells,
        wherein the first density of memory cells is configured to receive a first power and to have a first memory retention time;
        wherein the first section of memory cells is connected to an interconnect line using a first set of connectors;
    forming a second section of memory cells in the memory array,
        wherein the second section of memory cells is connected to the interconnect line using a second set of connectors having a lower resistance than the first set of connectors;
        wherein the second section has a second density of memory cells,
        wherein the second density of memory cells is configured to receive a second power and to have a second memory retention time,
        wherein the first density is higher than the second density,
        wherein the first power is lower than the second power,
        wherein the first memory retention time is shorter than the second memory retention time, and
        wherein a memory value is stored in the first section or in the second section based on a retention time requirement of the memory value.

2. A method as in claim 1 wherein the first power or the second power comprises a programming power, wherein the memory cells are configured so that higher programming power results in higher memory retention time.

3. A method as in claim 1 wherein the first power or the second power comprises an erasing power, wherein the memory cells are configured so that higher erasing power results in higher memory retention time.

4. A method as in claim 1 wherein the first power or the second power is proportional to the first density or the second density.

5. A method as in claim 1 further comprising forming a plurality of control transistors, wherein the control transistors are coupled to the memory cells, wherein the control transistors are operable to control the power applied to the memory cells.

6. A method as in claim 1 further comprising forming a first control circuit for determining a retention requirement of a memory value to be stored in a memory device in the memory array.

7. A method as in claim 1 further comprising determining the first memory retention time and the second memory retention time.

8. A method as in claim 1, wherein the second section of memory cells is closer to the interconnect line than the first section of memory cells.

9. A method as in claim 1, wherein the interconnect line is a part of a driver circuit.

10. A method as in claim 1, wherein the first set of connectors and the second set of connectors are parts of a same line.

11. A method as in claim 1, wherein the second section of memory cells forms a ring around the first section of memory cells.

12. A method as in claim 1, wherein the first set of connectors comprises one or more variable resistors each connected in series with a different memory cells of the first section.

13. A method as in claim 12, wherein the second set of connectors comprises one or more variable resistors each connected in series with a different memory cells of the second section.

* * * * *